(12) United States Patent
Wetzel et al.

(10) Patent No.: US 7,656,674 B2
(45) Date of Patent: Feb. 2, 2010

(54) CONTROL MODULE

(75) Inventors: Gerhard Wetzel, Korntal-Muenchingen (DE); Peter Sprafke, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 457 days.

(21) Appl. No.: 11/587,688

(22) PCT Filed: Jan. 17, 2006

(86) PCT No.: PCT/EP2006/050241

§ 371 (c)(1),
(2), (4) Date: Oct. 26, 2006

(87) PCT Pub. No.: WO2006/077208

PCT Pub. Date: Jul. 27, 2006

(65) Prior Publication Data

US 2008/0019106 A1  Jan. 24, 2008

(30) Foreign Application Priority Data

Jan. 20, 2005  (DE)  .................. 10 2005 002 813

(51) Int. Cl.
*H05K 5/00* (2006.01)
(52) U.S. Cl. .................................. 361/752; 361/800
(58) Field of Classification Search ................ 361/600, 361/752, 790, 797, 800, 736, 748, 760
See application file for complete search history.

(56) References Cited

U.S. PATENT DOCUMENTS 5,285,010 A * 2/1994 Huber ..................... 174/59

| | | | |
|---|---|---|---|
| 5,586,388 A | 12/1996 | Hirao et al. | |
| 5,699,233 A | 12/1997 | Zlamal | |
| 5,949,137 A * | 9/1999 | Domadia et al. ............. | 257/712 |
| 6,369,411 B2 * | 4/2002 | Matsumoto .................. | 257/182 |
| 6,570,773 B1 | 5/2003 | Loibl et al. | |
| 6,914,321 B2 * | 7/2005 | Shinohara .................... | 257/678 |
| 7,375,966 B2 * | 5/2008 | Murakami et al. .......... | 361/707 |

FOREIGN PATENT DOCUMENTS

| DE | 199 07 949 | 9/2000 |
|---|---|---|
| DE | 100 51 945 | 11/2001 |
| DE | 101 10 620 | 9/2002 |
| EP | 0 695 117 | 1/1996 |
| EP | 1 239 710 | 9/2002 |

* cited by examiner

*Primary Examiner*—Hung S Bui
(74) *Attorney, Agent, or Firm*—Michael J. Striker

(57) ABSTRACT

A control module, in particular for a motor vehicle transmission, which includes a first housing part, on which an electronic circuit part is located, a second housing part, and a carrier, on which a flexible conductor film is located; the flexible conductor film is electrically connected—in a housing interior located between the first housing part and the second housing part—with the circuit part and the flexible conductor film is electrically connected outside of the housing interior—with electrical components mounted on the carrier, the control module having a stack-shaped design, with which the carrier rests, via a first side, on an interior side of the first housing part on which the circuit part is mounted, the circuit part is located in a recess in the carrier, the flexible conductor film is located on the second side of carrier, which faces away from the first housing part, and the second housing part is mounted on a side of the flexible conductor film facing away from the second side of the carrier.

13 Claims, 6 Drawing Sheets

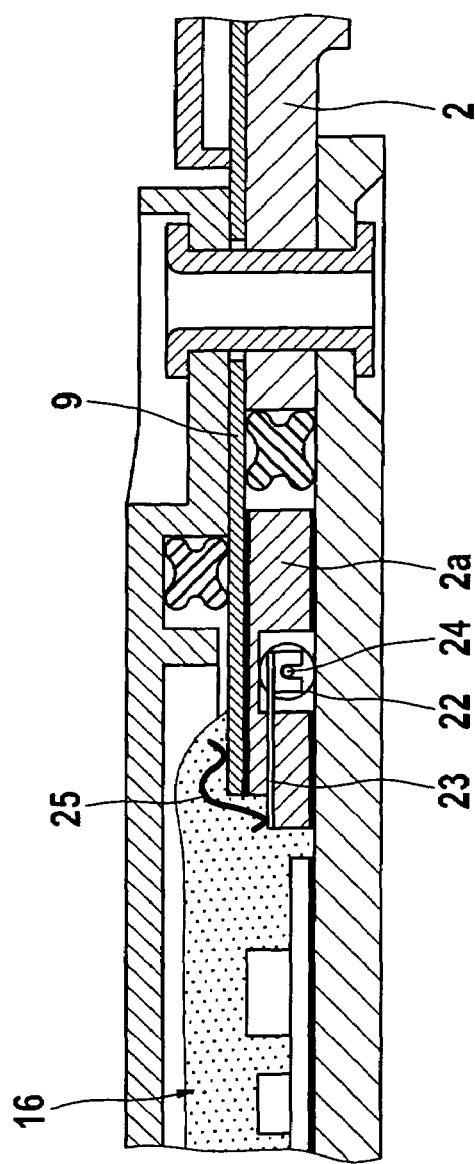
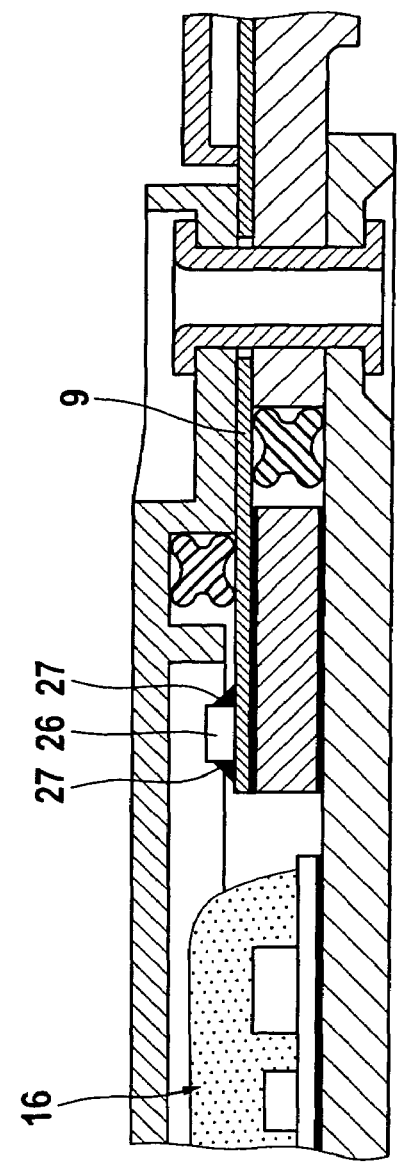

CONTROL MODULE

CROSS-REFERENCE TO RELATED APPLICATION

The invention described and claimed hereinbelow is also described in German Patent Application DE 10 2005 002 813.6-14 filed on Jan. 20, 2005. This German Patent Application provides the basis for a claim of priority of invention under 35 U.S.C. 119(a)-(d).

BACKGROUND OF THE INVENTION

The present invention relates to a control module, in particular a control module for a motor vehicle transmission.

A control module with the features listed in the preamble of claim 1 is made known, e.g., in DE 199 07 949 A1. Control modules of this type are designed to be mounted on a motor vehicle component such as the transmission or the engine, and have various components which are assigned to the motor vehicle components. Control modules for automatic transmissions include, e.g., a hybrid control unit with an electronic circuit part, sensors, and at least one plug connector for connecting to the vehicle wiring harness; some of them are located on the transmission such that they are exposed to the transmission fluid and the high temperatures—up to 150° C.—which occur there. To protect the sensitive electronic circuit part, it must be encapsulated in an oil-tight manner. To this end, the known control module includes a base plate, as the first housing part, which includes a plastic carrier as a flat, lateral extension. A flexible conductor film is laminated onto the plastic carrier and the base plate. A cover with an inserted seal is placed, as the second housing part, on the conductor film. In the housing interior, the conductor film is contacted via bonding wires with an electronic circuit part mounted on the base plate. Since the flexible conductor film is bonded with the base plate for sealing purposes, the relatively large composite part—which is composed of the base plate and the plastic carrier—must move through the entire process of electronics manufacture when the bonding wire connections are created, when the circuit is compensated, and through additional manufacturing steps.

SUMMARY OF THE INVENTION

In accordance with the present invention it is proposed to provide a control module, in particular for a motor vehicle transmission, which includes a control module, in particular for a motor vehicle transmission, which includes a first housing part, on which an electronic circuit part is located, a second housing part, and a carrier, on which a flexible conductor film is located; the flexible conductor film is electrically connected—in a housing interior located between the first housing part and the second housing part—with the circuit part and the flexible conductor film is electrically connected—outside of the housing interior—with electrical components mounted on the carrier, the control module having a stack-shaped design, with which the carrier rests, via a first side, on an interior side of the first housing part on which the circuit part is mounted, the circuit part is located in a recess in the carrier, the flexible conductor film is located on the second side of carrier, which faces away from the first housing part, and the second housing part is mounted on a side of the flexible conductor film facing away from the second side of the carrier.

The inventive control module requires particularly little assembly effort and can be manufactured cost-effectively. With a stack-shaped design, with which the carrier—which bears, via a first side, against an interior side of the first housing part on which the circuit part is mounted, and with which the circuit part is located in a recess in the carrier, the flexible conductor film is located on the second side of the carrier which faces away from the first housing part, and the second housing part is placed on the flexible conductor film, there is no need to laminate the flexible conductor film on the first housing part, on which the circuit part is mounted, and it is attained—in a particularly advantageous manner—that the control module can be composed essentially of an assembly for the connection functions, an assembly for the electronics functions, and a cover part. Particularly advantageously, the two assemblies can be manufactured and pretested separately, and then simply stacked in position. The electrical interface between the two assemblies can be designed such that the two assemblies can be connected electrically in a simple, robust manner.

Since the assembly for the electronics functions can be manufactured without the flexible conductor film, it can be manufactured more cost-effectively, since the assembly of the electronic circuit part and the contacting of the electronic components with the conductive tracks of the circuit part can be carried out using bonding wires in single-substrate manufacture. To this end, a LTCC (low temperature cofired ceramic) substrate, for example, is manufactured in panels and subdivided into single substrates, which are then bonded individually on a small, flat metallic base plate—preferably an aluminum plate—which forms the first housing part. LTCC substrates identified as being faulty are sorted out immediately after separation. Electronic components are then installed on the individual assemblies, each of which is composed of a base plate and an LTCC substrate. The electrical contacting of the components with the substrate can be carried out using gold bond wires, or in another suitable manner. Due to the small dimensions of the base plate, the component-installation and bonding processes can be carried out on standard machines. The assembly can then be subjected to various functionality tests, some of which are carried out at very high and very low temperatures, from 120° C. to −20° C. Since the assembly has a very fine mass, warming and cooling can be carried out very quickly. The assembly for the electronic functions of the control module can be manufactured largely as a standard component and, independently of the assembly provided for the connection functions, it can be replaced with an assembly with a different standard but the same geometric dimensions.

The assembly for the connection functions includes the carrier, and the flexible conductor film and sensors mounted thereon, the plug connector and, optionally, an additional cover. The functionality of this assembly can be tested in terms of the electronic functions, independently of the assembly. Advantageously, individual electronic components such as capacitors can be installed with wire connections in this recess of the carrier and contacted with the conductor film, so that, in the finished control module, these components are located inside the housing and are protected against contaminants and fluctuating-temperature stresses. Electronic components can also be installed directly on the conductive tracks of the flexible conductor film, however, e.g., via soldering, using conductive adhesive, or bonding. Since the components are installed during manufacture of the assembly for the connection functions, attention is need not be paid to the fine structures of the LTCC substrate, e.g., it is not possible for flux to contaminate the LTCC substrate. In the finished control module, however, the components are housed in the sealed housing interior and are protected.

After manufacture, the two assemblies can be simply stacked on top of each other. The electrical connection is carried out preferably using bonding wires which connect the LTCC substrate with the flexible conductor film. After gel filling, i.e., after gel is applied to the recess in the carrier in which the LTCC substrate is also located, the gel can be hardened. The second housing part—which is a cover—is subsequently placed on the conductor film. A separate opening for filling the gel, which would have to be closed using a separate seal, can be advantageously eliminated. Finally, the stack, which has been formed in this manner, is held together using fastening elements.

Exemplary embodiments of the present invention are presented in the drawing and are described in the description below.

BRIEF DESCRIPTION OF THE DRAWINGS

FIG. 4 shows a partial section of a cross section through a fourth exemplary embodiment, FIG. 5 shows a partial section of a cross section through a fifth exemplary embodiment.

DESCRIPTION OF THE PREFERRED EMBODIMENTS

Figure 1:
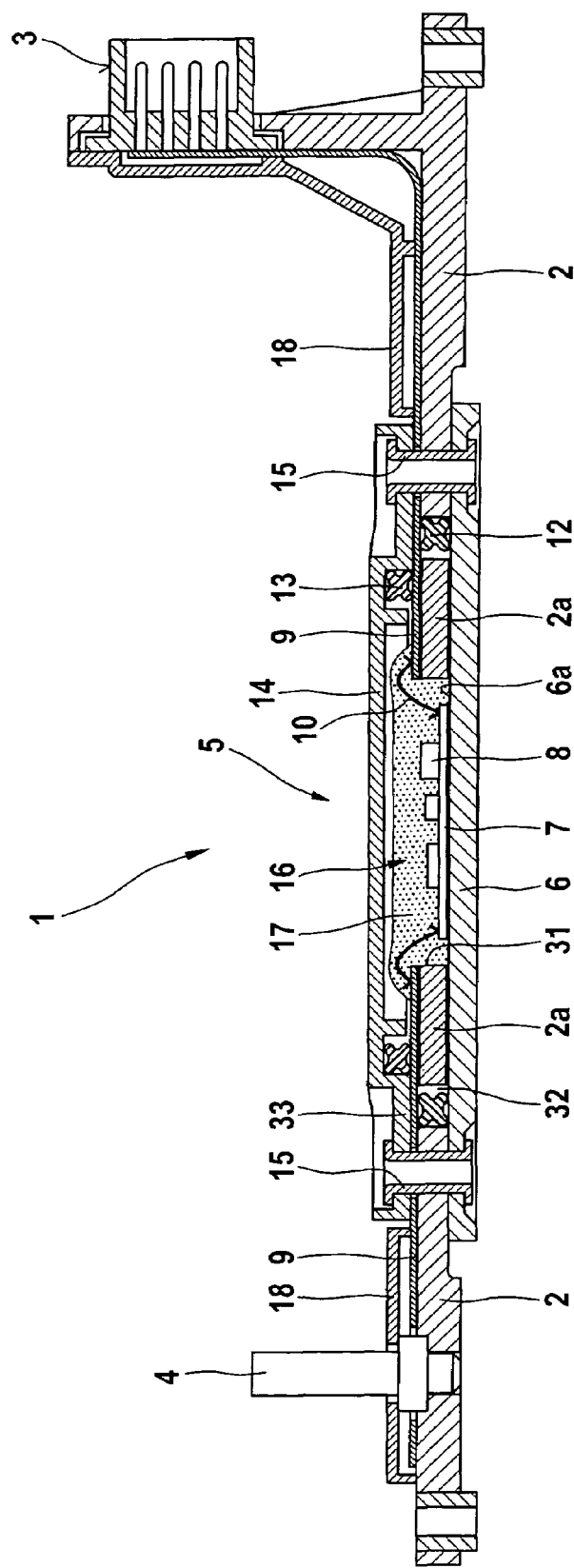
FIG. 1 shows a cross section through a first exemplary embodiment of the inventive control module.

FIG. 1 shows a cross section through a first exemplary embodiment of the inventive control module. Control module 1 includes a carrier 2 made of metal or plastic, which is mountable, e.g., on the transmission of a motor vehicle, and on which various components are installed, such as sensors 4, a plug connector part 3, and, optionally, hydraulic valves (not shown) for controlling actuators of the transmission, and a transmission control unit 5. Control unit 5 includes a first housing part 6 which is preferably designed as a metallic base plate, e.g., out of aluminum. An electronic circuit part 7, e.g., a LTCC (low-temperature cofired ceramic) substrate, on which electronic components 8 are installed, is bonded to the interior side 6a of first housing part 6. Components 8 can be connected via gold bonding wires with the conductive tracks of the LTCC substrate. Circuit part 7 is connected with a flexible conductor film 9 via contact elements, e.g., aluminum bonding wires 10. Flexible conductor film 9 can be composed of one of the usual carrier sheets made of polyimide, on which the copper conductive tracks are formed and which are structured using the photo process and configured via etching, and which are insulated to the outside using a protective coating or an additional film.

As shown in FIG. 1, large-surface, flexible conductor film 9 is placed on a carrier 2, 2a, which, in the first exemplary embodiment, has a two-component design and includes a rectangular frame part 2a made, e.g., of plastic, and a support part 2 made of metal or plastic, which encloses frame part 2a and extends away from it. The carrier and conductor film 9 include a rectangular recess 31 for accommodating circuit part 7. Flexible conductor film 9 rests on the side of frame part 2a facing away from first housing part 6 and can be fixed in position there, e.g., using an adhesive. Flexible conductor film 9 also rests on the side of support part 2 facing away from the first housing part and is fixed in position there—outside of second housing part 14—by a cover 18, which presses the conductor film against the support part. Cover 18 can be used simultaneously to fix plug connector part 3 and sensors 4 in position. A circumferential intermediate space 32 is provided between frame part 2a and support part 2, in which a circumferential first sealing element 12 (e.g., an elastic sealing ring) is located, which bears, in a sealing manner, against interior side 6a of first housing part 6 and against flexible conductor film 9.

A second housing part 14, which serves as a cover part, is placed on flexible conductor film 9; second housing part 14 can be, e.g., an injection-moulded part made of plastic, or a metallic cover part. A circumferential, second sealing element 13 is located in a groove of second housing part 14, which bears in a sealing manner against housing part 14 and conductor film 9. Second sealing element 14 has a somewhat smaller diameter than first sealing element 13; the two sealing elements are therefore not located one over the other, but rather are offset relative to each other.

The stack, which is composed of first housing part 6, carrier 2, large-surface conductor film 9, and second housing part 14, is provided at the edges of the first and second housing part with several continuous recesses in which fastening elements 15 in the form of rivets, screws, detent means, or similar means are inserted. The stack is pressed together by fastening elements 15, so that second housing part 14 presses elastic second sealing element 13 against the top side of conductor film 9, which rests on frame part 2a at this point, and first housing part 6 presses elastic first sealing element 12 against the underside of conductor film 9, which bears against a circumferential collar 33 of second housing part 14 at this point. An oil-tight housing interior 16 in which circuit part 7 and bonding wires 10 are located and protected is formed in this manner using only two sealing elements. Components 8 of electronic circuit part 9 are passivated in a known manner using a covering material 17, e.g., a gel, which is placed in recess 31.

Figure 2:
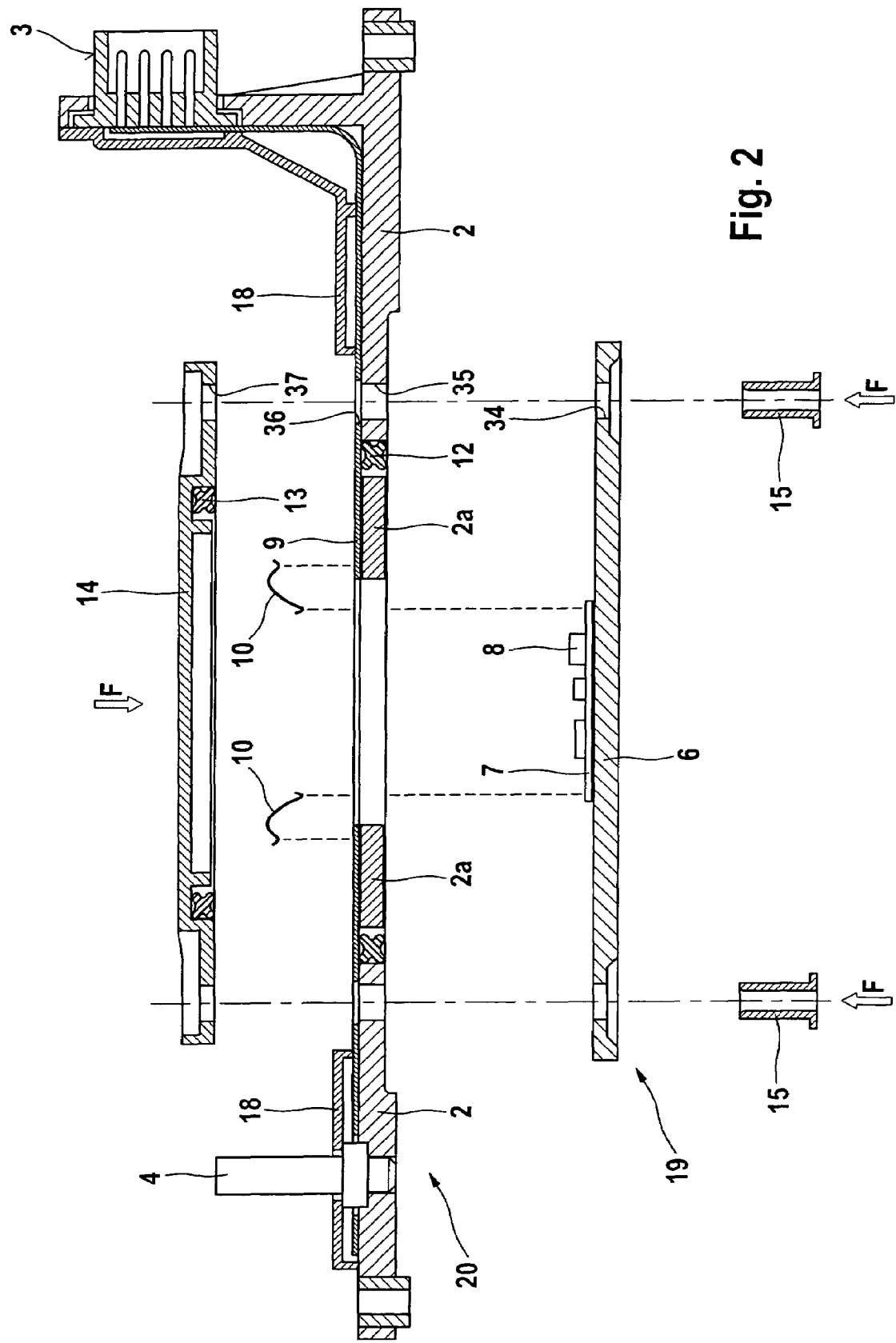
FIG. 2 depicts the manufacture of the exemplary embodiment in FIG. 1.

FIG. 2 shows how the first exemplary embodiment of the inventive control module can be manufactured using pre-testable, modular assemblies. A first assembly 19 for the electronic functions includes first housing part 6 and electronic circuit part 7 bonded thereon. This assembly is manufactured by subdividing a large-surface LTCC substrate, which is manufactured in panels, into individual substrates, which are subsequently bonded to housing parts 6. Components 8 are subsequently installed on the LTCC substrates and are contacted with the conductive tracks of the substrate using bonding wires. Due to the relatively small spacial expansion of the first housing part, the processes can be carried out on standard machines. Finally, the functionality of finished assembly 19 is tested. Second assembly 20 for the connection functions includes support part 2, which is made of plastic or metal, on which plug connector parts 3 and sensors 4 are fixed in position, and a rectangular frame part 2a inserted in a rectangular recess of support part 2, first sealing element 12, and large-surface, flexible conductor film 9. As a first step in manufacture, conductor film 9 is bonded, via its interior region, with circumferential frame part 2a. The outer circumferential region of conductor film is subsequently placed on support part 2, then cover 18 is placed on conductor film 9. Finally, plug connector part 3 and sensors 4 are electrically connected with the conductor film.

Final assembly of the control module takes place by stacking assemblies 19 and 20; fastening elements 15 serve as centering aids and joining means. To this end, as shown in FIG. 2, the fastening elements are first positioned on a workpiece carrier. First assembly 19 is then placed on fastening elements 15, which extend through recesses 34 of the base plate. Second assembly 10 is then placed in position, so that frame part 2a and first sealing element 12 are positioned on the interior side 6a of first housing part 6. Frame part 2a is fixed in position using pegs engraved in housing part 6 or a bond between frame part 2a and housing part 6. Fastening elements 15 extend through recesses 35 in support part 2 and recesses 36 in conductor film 9. The two assemblies are connected with each other electrically using bonding wires 10 between circuit part 7 and conductor film 9, and a gel which covers circuit part 7 is applied to recess 31. After the gel is applied, it can be hardened. Finally, second housing part 14—together with second sealing element 13—is placed on conductor film 9. The fastening elements extend through recesses 37 of the second housing part, and the stack is pressed together with force F, thereby closing housing interior 16 in an oil-tight manner.

Figure 3:
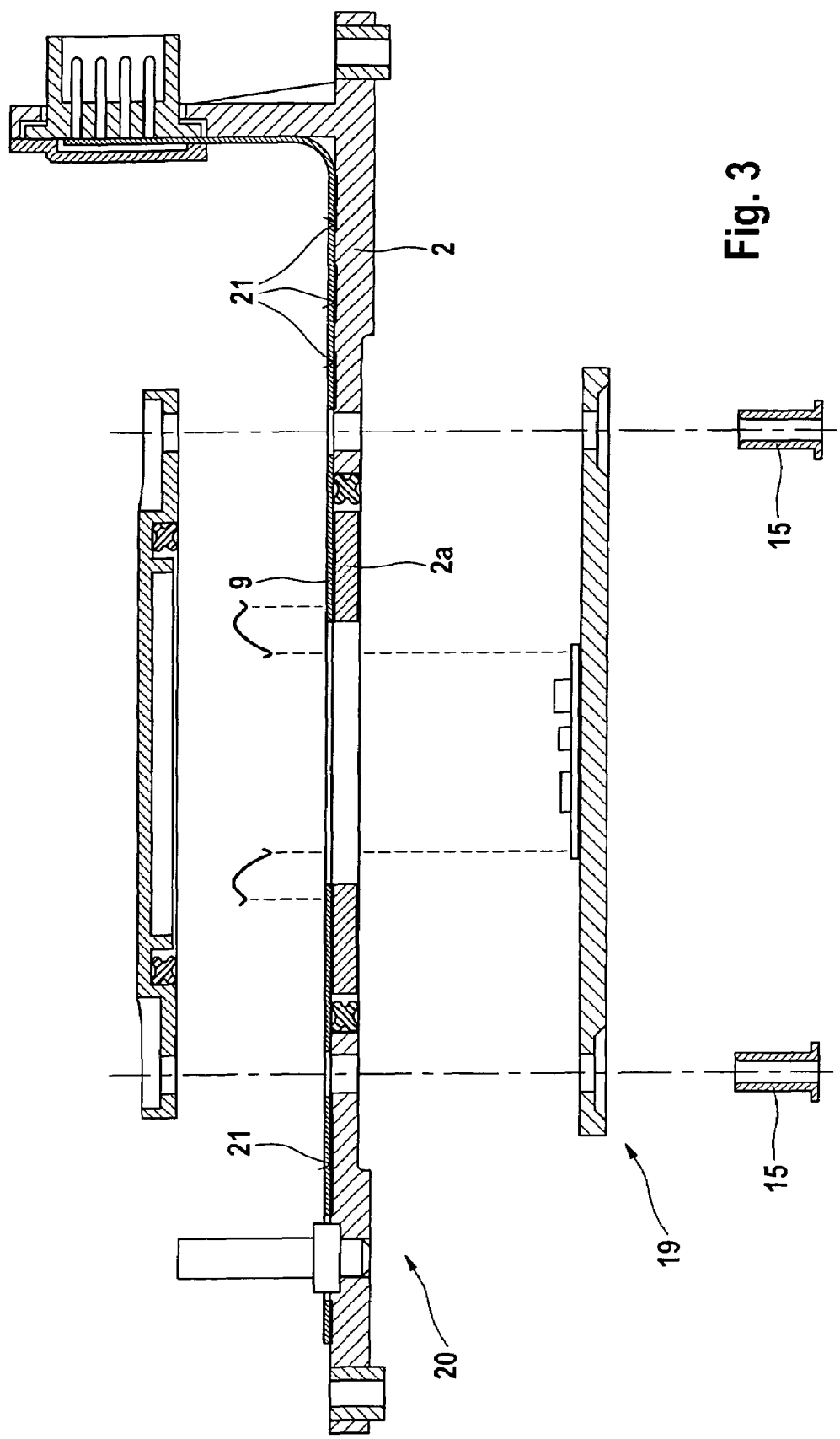
FIG. 3 depicts the manufacture of a second exemplary embodiment.

FIG. 3 shows how a second exemplary embodiment of the inventive control module is manufactured using pre-testable assemblies. A cover 18 is not provided with this exemplary embodiment. Instead, flexible conductor film 9 is bonded not only to frame part 2a, but also to support part 2, using an adhesive 21. This bonding can take place over the entire contact area of the large-surface, flexible conductive track 9 on the carrier, or only in sub-areas, as shown in FIG. 3.

If support part 2 is manufactured out of plastic as an injection-moulded part, flexible conductor film 9 can also be injected into support part 2, in a third exemplary embodiment.

FIG. 4 shows a partial section of a cross section through a fourth exemplary embodiment of the present invention. In this exemplary embodiment, individual electronic components 22 are not mounted on circuit part 7. Instead, they are located inside frame part 2a in housing interior 16. Moving electronic components 22 to this different location can be advantageous in that it allows the size of circuit part 7 to be reduced. Large components in particular can therefore be located at a point other than on circuit part 7. For example, a wire component can be contacted electrically with an electrical conductor 23 inserted in the frame part, in the form of a stamped grid part, e.g., using a cleft joint 24. The electrical contacting of conductor 23 with the conductive tracks of conductor film 9 takes place advantageously using bonding wires 25, which can be manufactured using the same connection process and the same bonding means as bonding wires 10 between the flexible conductor film and circuit carrier 7. The positioning of components 22 in a recess of frame part 2a, which is closed by first housing part 6, also offers the advantage that component 22 is well-enclosed on all sides and is secured mechanically in position; this results in great robustness against stressing by oscillations and vibrations.

A fifth exemplary embodiment is shown in FIG. 5. In this case, an individual, electrical component 26 is placed inside oil-tight housing interior 16 directly on contact surfaces of flexible conductor film 9 and are electrically contacted therewith. This can be a SMD (surface mounted device) component, for example. As shown in FIG. 5, on the free side of flexible conductor film 9, component 26 is connected electrically and mechanically to the conductor film using a contact adhesive 27.

Figure 6:
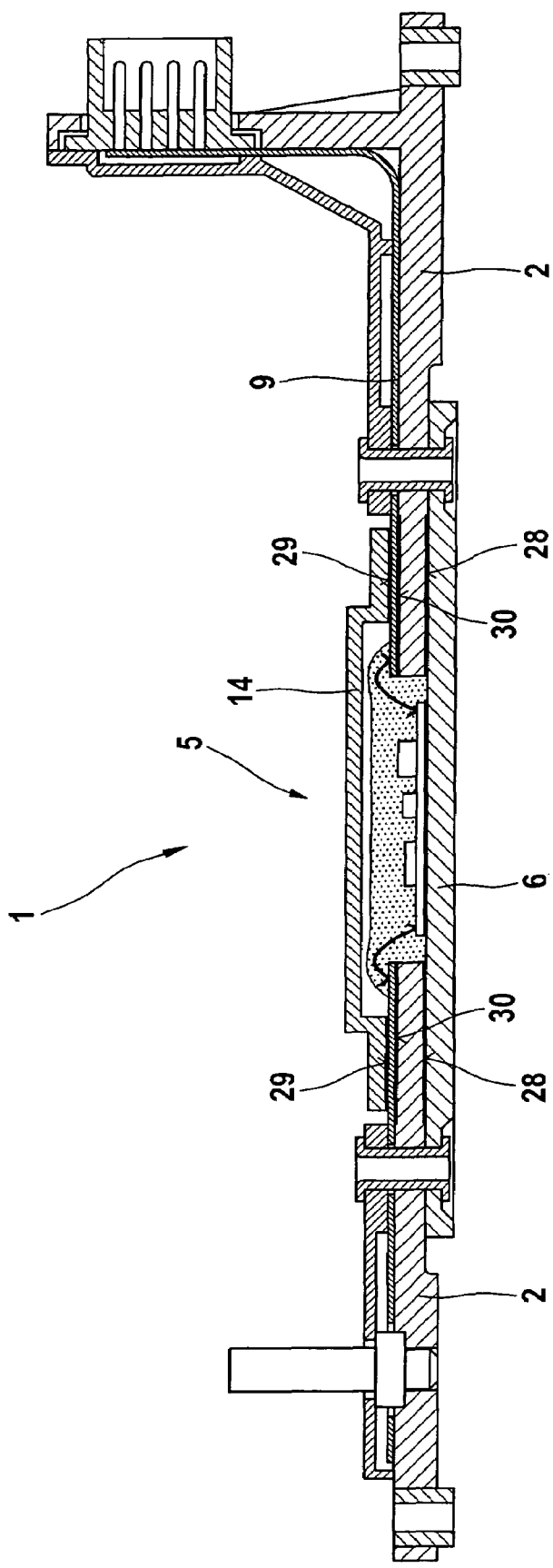
FIG. 6 shows a cross section through a sixth exemplary embodiment.

FIG. 6 shows a sixth exemplary embodiment of control module 1, with which carrier 2 has a single-component design, and control unit 5 is sealed not using sealing elements, but using a sealing adhesive, e.g., an epoxide adhesive or an acrylic adhesive. To this end, a section of carrier 2 which surrounds circuit part 7 is bonded in a sealing manner, via its underside and via circumferential adhesive layer 28, with the interior side 6a of is first housing part 6. Flexible conductor film 9 is bonded via circumferential adhesive layer 30 in a sealing manner on the side of carrier 2 which faces away from first housing part 6. On the side of flexible conductor film 9 facing away from carrier 2, second housing part 14 is bonded in a sealing manner via a third circumferential adhesive layer 29 onto flexible conductor film 9. In this exemplary embodiment, therefore, the first and second sealing elements of the first exemplary embodiment are replaced with sealing adhesive, and the bonding between the conductor film and the carrier provided in the first exemplary embodiment to fix components in position is carried out using a sealing adhesive. A particular advantage of this exemplary embodiment is the fact that carrier 2 is guided as a single component directly into control unit 5, e.g., as a third housing part, thereby resulting in a rigid assembly for the connection functions, which simplifies the assembly process. There is no need to insert sealing elements.

Figure 7:
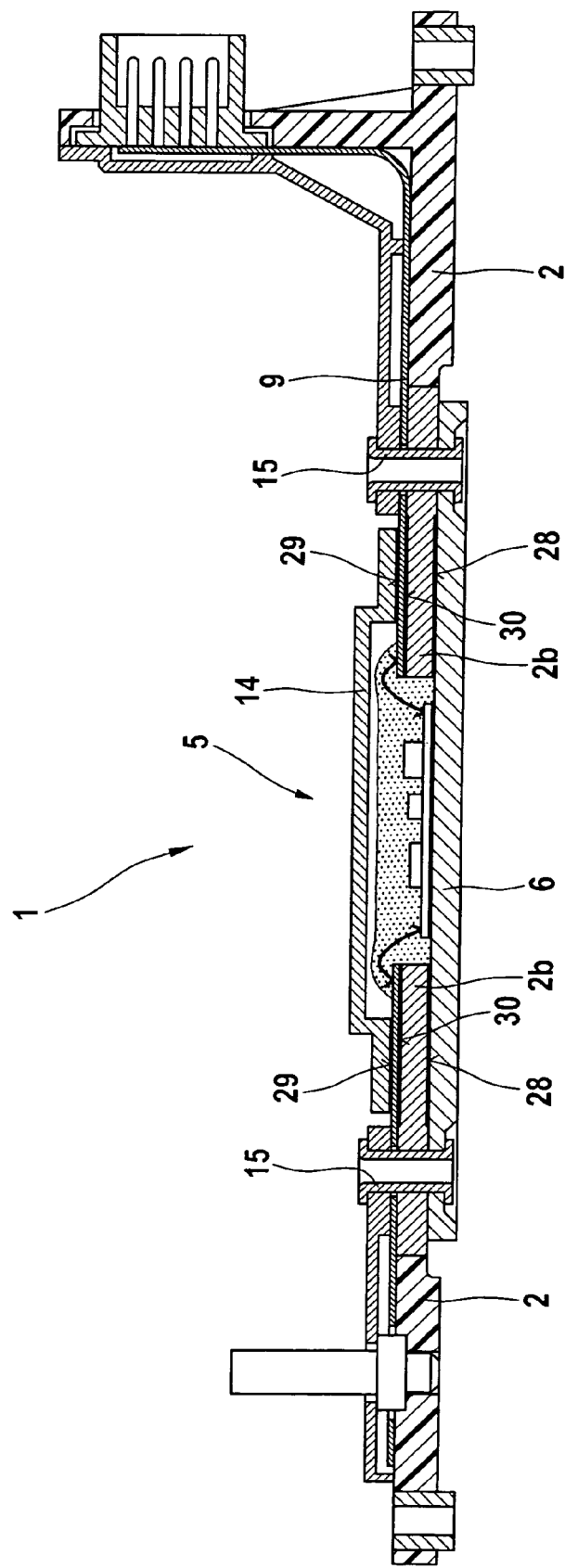
FIG. 7 shows a cross section through a seventh exemplary embodiment.

FIG. 7 shows a seventh exemplary embodiment of the present invention. In this exemplary embodiment, carrier 2 is designed as a connecting part in area 2b of adhesive layers 28, 29, and fastening elements 15 are made partially of metal, preferably aluminum. The remaining part of carrier 2 is preferably designed as an injection-moulded part. This results in the advantage that similar materials with similar expansion coefficients can be bonded in the region of the adhesive bonds.

It is understood that the exemplary embodiments shown can also be combined with each other, and that the present invention includes, e.g., configurations with which only one of the sealing elements in FIG. 1 is replaced with a sealing bond, e.g., one of the sealing bonds in FIGS. 6 and 7 is replaced with a sealing element. Combinations of the exemplary embodiments shown in FIGS. 4 and/or 6 with the exemplary embodiments in FIGS. 6 and 7 are also possible, of course.

LIST OF REFERENCE NUMERALS

1. Control module
2. Carrier
2a. Frame part
2b. Area
3. Plug connector part
4. Sensor
5. Control unit
6. First housing part
6a. Interior side
7. Electronic circuit part
8. Components
9. Flexible conductor film
10. Bonding wires
12. First sealing element
13. Second sealing element
14. Second housing part
15. Fastening means
16. Housing interior
17. Covering material
18. Cover
19. First assembly
20. Second assembly
21. Adhesive
22. Component
23. Conductor
24. Cleft joint 25. Bonding wire
26. Component
27. Contact adhesive
28, 29, 30. Adhesive layers
31. Recess
32. Intermediate space
33. Collar
34, 35, 36. Recesses

What is claimed is:

1. A control module, in particular for a motor vehicle transmission, which includes a first housing part (6), on which an electronic circuit part (7) is located, a second housing part (14), and a carrier (2), on which a flexible conductor film (9) is located;

the flexible conductor film (9) is electrically connected—in a housing interior (16) located between the first housing part and the second housing part—with the circuit part and the flexible conductor film is electrically connected—outside of the housing interior—with electrical components (4, 3) mounted on the carrier, the control module having a stack-shaped design, with which the carrier (2, 2a, 2b) rests, via a first side, on an interior side (6a) of the first housing part (6) on which the circuit part is mounted, the circuit part (7) is located in a recess (31) in the carrier (2, 2a, 2b), the flexible conductor film (9) is located on the second side of carrier (2, 2a, 2b), which faces away from the first housing part (6), and the second housing part (14) is mounted on a side of the flexible conductor film (9) facing away from the second side of the carrier (2, 2a, 2b).

2. The control module as recited in claim 1, wherein the carrier (2, 2a) has a two-component configuration, with a first frame part (2a) which encloses the circuit part, and a support part (2) which encloses the frame part; the frame part (2a) is separated from the support part (2) via an intermediate space (32) in which a first sealing element (12) is located, and bears, in a sealing manner, against the interior side (6a) of the first housing part (6), and against the flexible conductor film (9).

3. The control module as recited in claim 1, wherein a sealing adhesive (28) is located between the carrier (2, 2b) and the interior side (6a) of the first housing part (6).

4. The control module as recited in claim 1, wherein a second sealing element (13) is provided, which bears, in a sealing manner, against the flexible conductor film (2) and the second housing part (14).

5. The control module as recited in claim 1, wherein a sealing adhesive (29) is located between the second housing part (14) and the conductor film (9).

6. The control module as recited in claim 1, wherein the flexible conductor film (9) has an area covered by the second housing part (14), and wherein a cover (18), which is secured to the carrier (2, 2a), is placed on an area of the flexible conductor film (9) outside of said area covered by the second housing part (14).

7. The control module as recited in claim 1, wherein the carrier (2, 2b), as a connecting piece, is formed by the frame part (2b) which encloses the circuit part (7), and a support part (2) which abuts the frame part outside of the housing interior (16).

8. The control module as recited in claim 1, wherein the stack, which is formed by the first housing part (6), the carrier (2, 2a, 2b), the flexible conductor film (9), and the second housing part (14), is held together by at least one fastening element (15).

9. The control module as recited in claim 8, wherein the stack, which is formed by the first housing part (6), the carrier (2, 2a, 2b), the flexible conductor film (9), and the second housing part (14), includes at least one recess, into which at least one fastening element (15) which holds the stack together is inserted.

10. The control module as recited in claim 1, wherein, between the first housing part (6) and the second housing part (14), at least one electrical component (22) is located in a recess of the carrier (2, 2a, 2b) and is contacted with the flexible conductor film (9) via electrical connecting elements (23, 25).

11. The control module as recited in claim 1, wherein, in the housing interior (16) between the first housing part (6) and the second housing part (14), at least one electrical component (26) is mounted on the conductor film (9), and is electrically contacted therewith.

12. The method for manufacturing a control module as recited in claim 1, wherein the first housing part (6), with the circuit part (7) mounted thereon, is manufactured as a first assembly (19) and, independently thereof, the carrier (2, 2a) is manufactured as a second assembly (20) with the electrical components (3, 4) located thereon and with the flexible conductor film (9) located thereon, and, optionally, with the cover (18), and wherein the second assembly (20) is placed on the first assembly (19), and the electrical circuit part (7) is subsequently contacted with the flexible conductor film (9), preferably via bonding wire connections (10).

13. The method as recited in claim 12, wherein, after the two assemblies (19, 20) are assembled and, optionally, after a covering material (17) is placed over the circuit part (7), the second housing part (14) is placed on the flexible conductor film (9), and the first housing part, the carrier, the flexible conductor film, and the second housing part are fixed to each other using at least one fastening element (15).

* * * * *